US011105738B2

(12) United States Patent
Takei et al.

(10) Patent No.: US 11,105,738 B2
(45) Date of Patent: Aug. 31, 2021

(54) SENSOR WIRING SUBSTRATE, SENSOR PACKAGE, AND SENSOR DEVICE

(71) Applicant: KYOCERA Corporation, Kyoto (JP)

(72) Inventors: Yuusuke Takei, Kirishima (JP); Ryuuji Mori, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 167 days.

(21) Appl. No.: 16/463,554

(22) PCT Filed: Nov. 17, 2017

(86) PCT No.: PCT/JP2017/041569
§ 371 (c)(1),
(2) Date: May 23, 2019

(87) PCT Pub. No.: WO2018/097071
PCT Pub. Date: May 31, 2018

(65) Prior Publication Data
US 2019/0376889 A1    Dec. 12, 2019

(30) Foreign Application Priority Data

Nov. 28, 2016 (JP) ............................ JP2016-229715
Jan. 25, 2017 (JP) ............................ JP2017-011706

(51) Int. Cl.
*G01N 21/3504* (2014.01)
*H01L 23/24* (2006.01)
*H04R 1/00* (2006.01)

(52) U.S. Cl.
CPC ......... *G01N 21/3504* (2013.01); *H01L 23/24* (2013.01); *H04R 1/005* (2013.01)

(58) Field of Classification Search
CPC .......... G01N 21/3504; G01N 29/2431; G01N 29/222; G01N 29/02; G01N 29/022;
(Continued)

(56) References Cited

U.S. PATENT DOCUMENTS

| 5,841,017 A | 11/1998 | Baraket et al. |
| 2011/0296900 A1* | 12/2011 | Thorson ............. G01N 21/1702 73/24.02 |
| 2014/0070101 A1 | 3/2014 | Matsushima et al. |

FOREIGN PATENT DOCUMENTS

| JP | 2000-019108 A | 1/2000 |
| JP | 2005-114675 A | 4/2005 |
| JP | 2011-252906 A | 12/2011 |

* cited by examiner

*Primary Examiner* — David P Porta
*Assistant Examiner* — Meenakshi S Sahu
(74) *Attorney, Agent, or Firm* — Volpe Koenig

(57) ABSTRACT

The present invention relates to a sensor wiring substrate in which a decrease in detection accuracy is suppressed, a sensor package, and a sensor device. A gas sensor wiring substrate includes a substrate having a first accommodation recessed portion for accommodating a microphone element and a second accommodation recessed portion for accommodating an infrared light emitting element, and connection wiring. In the gas sensor wiring substrate, thermal resistance of a heat transfer path between a bottom surface of the first accommodation recessed portion and a bottom surface of the second accommodation recessed portion is greater than thermal resistance in any position of an imaginal heat transfer path in case of a depth of the first accommodation recessed portion identical with a depth of the second accommodation recessed portion. For example, the depth of the second accommodation recessed portion is deeper than the depth of the first accommodation recessed portion.

19 Claims, 25 Drawing Sheets

(58) Field of Classification Search
CPC .............. G01N 29/2425; G01N 29/32; G01N 29/2418; G01N 2291/101; G01N 2291/021; G01N 21/00; G01N 21/37; G01N 29/24; H01L 23/24; H04R 1/005
See application file for complete search history.

SENSOR WIRING SUBSTRATE, SENSOR PACKAGE, AND SENSOR DEVICE

TECHNICAL FIELD

The present invention relates to a sensor wiring substrate, a sensor package, and a sensor device.

BACKGROUND ART

A gas sensor that detects the presence or concentration of various gases such as carbon dioxide ($CO_2$), ammonia ($NH_3$) or ethyl alcohol ($C_2H_5OH$) is used in every application such as each household, various stores, and industrial facilities. A measurement principle is different for each target substance to be detected or different depending on required detection accuracy.

Two recessed portions are disposed on a substrate of the gas sensor described in PTL 1. An infrared light source element is accommodated in one recessed portion, and a microphone is accommodated in the other recessed portion. The substance to be detected is excited by infrared light emitted from the infrared light source element, and a generated sound wave is detected by the microphone.

CITATION LIST

Patent Literature

PTL 1: Japanese Unexamined Patent Application Publication No. 2011-252906

SUMMARY OF INVENTION

A sensor wiring substrate according to the present disclosure includes a plate-like substrate comprising a plurality of dielectric layers that are laminated, and connection wiring. In the substrate, a first accommodation recessed portion for accommodating an acoustic element and a second accommodation recessed portion for accommodating an infrared light emitting element that are disposed on a first surface, wherein thermal resistance of a heat transfer path between a bottom surface of the first accommodation recessed portion and a bottom surface of the second accommodation recessed portion is greater than thermal resistance in any position of an imaginal heat transfer path in a case of a depth of the first accommodation recessed portion identical with a depth of the second accommodation recessed portion. The connection wiring includes a first connection terminal disposed in the first accommodation recessed portion for electrically connecting to the acoustic element, a second connection terminal disposed in the second accommodation recessed portion for electrically connecting to the infrared light emitting element, external connection terminals for electrically connecting to an external circuit, and inner layer wiring electrically connecting the first connection terminal and the second connection terminal to the external connection terminals, respectively.

A sensor package according to the present disclosure includes the above sensor wiring substrate and a cover body covering the first surface of the substrate with a space between the cover body and the first surface, in which a gaseous substance for detection is to be introduced into the space.

A sensor device according to the present disclosure includes the above sensor package, the acoustic element in the first accommodation recessed portion, and the infrared light emitting element in the second accommodation recessed portion.

BRIEF DESCRIPTION OF DRAWINGS

The objects, features and advantages of the present invention will be more apparent from the following detailed description and the drawings.

DESCRIPTION OF EMBODIMENTS

A sensor wiring substrate of the present disclosure is configured such that thermal resistance of a heat transfer path between a bottom surface of a first accommodation recessed portion for accommodating an acoustic element and a bottom surface of a second accommodation recessed portion for accommodating an infrared light emitting element is greater than thermal resistance at any position of an imaginal heat transfer path (hereinafter, may be referred to as imaginal path) in a case of a depth of the first accommodation recessed portion identical with a depth of the second accommodation recessed portion in a substrate. As a result, heat generated by the infrared light emitting element, which is a heat source, is made difficult to move to the acoustic element, and heating of the acoustic element is reduced to suppress a decrease in detection accuracy.

A configuration of the substrate may be any configuration as long as the thermal resistance of the heat transfer path between the bottom surface of the first accommodation recessed portion and the bottom surface of the second accommodation recessed portion is larger than the thermal resistance of the imaginal path, and is not limited to a specific configuration. For example, a distance between the bottom surface of the first accommodation recessed portion and the bottom surface of the second accommodation recessed portion may be made longer than a distance between the bottom surfaces in the imaginal path. For example, in the substrate, a low heat conduction portion having low thermal conductivity may be disposed between the bottom surface of the first accommodation recessed portion and the bottom surface of the second accommodation recessed portion.

Regarding the substrate configuration, first, a configuration (configuration A) of increasing the distance between the bottom surfaces will be described, and thereafter a configuration (configuration B) of disposing the low heat conduction portion will be described.

(Configuration A)

Figure 1A:
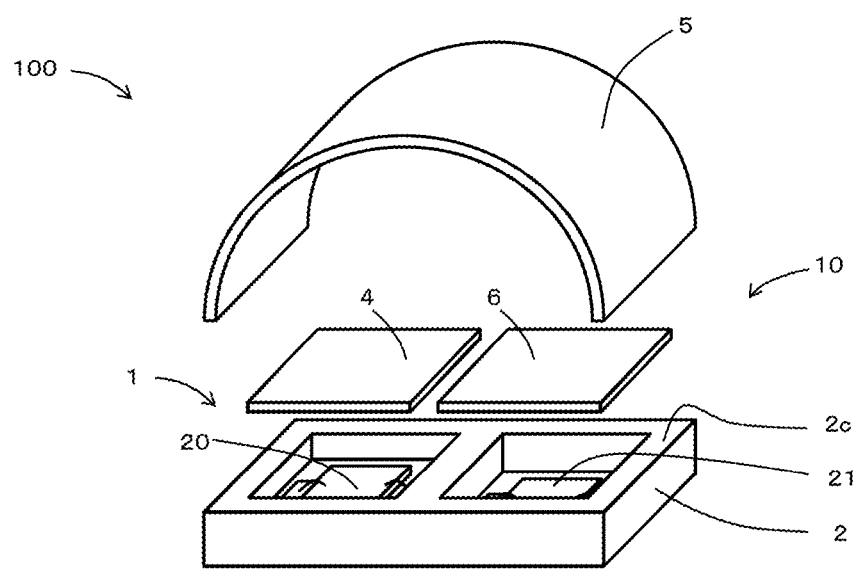
FIG. 1A is an exploded perspective view illustrating a gas sensor wiring substrate, a gas sensor package, and a gas sensor according to a first embodiment.
Figure 1B:
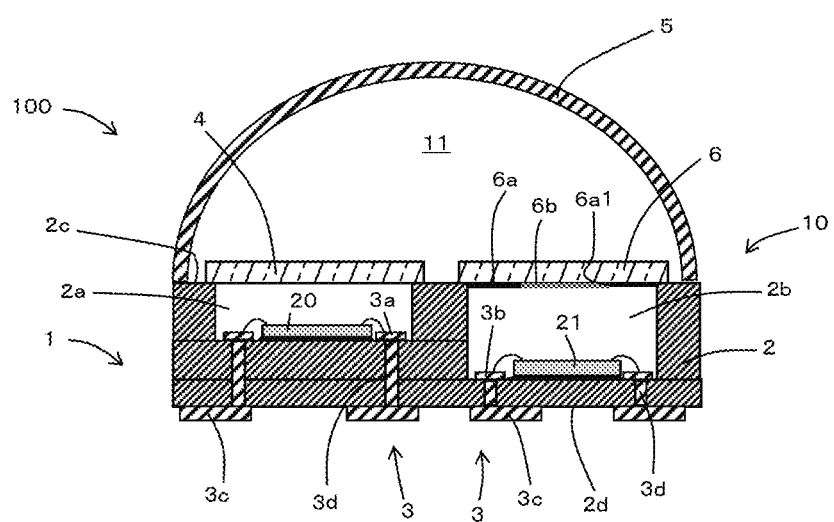
FIG. 1B is a sectional view illustrating the gas sensor wiring substrate, the gas sensor package, and the gas sensor according to the first embodiment.

FIG. 1 is a view illustrating a gas sensor wiring substrate 1, a gas sensor package 10, and a gas sensor 100 according to the first embodiment. FIG. 1A is an exploded perspective view, and FIG. 1B is a sectional view. The exploded perspective view of FIG. 1A is an exploded perspective view in which a first lid 4, a second lid 6, and a cover body 5 are separated.

The gas sensor wiring substrate 1 includes the substrate 2 and connection wiring 3. The substrate 2 of the present embodiment has a rectangular plate shape, and comprise a plurality of dielectric layers that are laminated. At least two recessed portions are disposed in the substrate 2. One of the two recessed portions is a first accommodation recessed portion 2a for accommodating a microphone element 20 as the acoustic element, and the other of the two recessed portions is a second accommodation recessed portion 2b for accommodating the infrared light emitting element 21. The first accommodation recessed portion 2a and the second accommodation recessed portion 2b are disposed so as to open to one main surface (first surface) 2c of the substrate 2.

In the present embodiment, a depth of the first accommodation recessed portion 2a is made different from a depth of the second accommodation recessed portion 2b to have the configuration in which the distance between the bottom surface of the first accommodation recessed portion 2a and the bottom surface of the second accommodation recessed portion 2b is longer than the distance between the bottom surfaces in the imaginal path. The infrared light emitting element 21 in the second accommodation recessed portion 2b generates heat during operation, and the heat is transferred inside the substrate 2 to be applied to the microphone element 20 in the first accommodation recessed portion 2a. When the microphone element 20 is thermally expanded and distorted due to this heating, the detection accuracy of the sound wave is reduced. In the configuration in the related art, the depth of the first accommodation recessed portion 2a is the same as the depth of the second accommodation recessed portion 2b, and the depth of the first accommodation recessed portion 2a and the depth of the second accommodation recessed portion 2b are different from each other as in the present embodiment. Therefore, the heat transfer path from the infrared light emitting element 21 as a heat source to the microphone element 20 is longer than the distance between the bottom surfaces in the virtual path. As a result, the heating of the microphone element 20 can be suppressed to reduce distortion as compared with the related art, and the decrease in the detection accuracy of the sound wave can be reduced.

Furthermore, the depth of the second accommodation recessed portion 2b is deeper than the depth of the first accommodation recessed portion 2a. Therefore, the distance between the infrared light emitting element 21 as a heat source and the other main surface (second surface) 2d opposite to the one main surface 2c of the substrate 2 is short. The heat generated by the infrared light emitting element 21 is transferred in multiple directions including the direction of the first accommodation recessed portion 2a and the direction of the other main surface 2d. Here, since the other main surface 2d is a heat dissipation surface, by shortening the distance between the infrared light emitting element 21 and the other main surface 2d, the heat is easily transferred to the other main surface 2d, and the heat transfer to the first accommodation recessed portion 2a is further suppressed.

In the present embodiment, a thickness of the substrate 2 is, for example, 1 to 2 mm, a depth of the first accommodation recessed portion 2a is, for example, 0.5 to 1 mm, and a depth of the second accommodation recessed portion 2b is, for example, 0.7 to 1.5 mm.

The first accommodation recessed portion 2a and the second accommodation recessed portion 2b may have, for example, a circular shape, a square shape, a rectangular shape, or the like, and may have another shape. The first accommodation recessed portion 2a and the second accommodation recessed portion 2b may have a sectional shape parallel to the main surface of the substrate 2 with a uniform sectional shape in a depth direction, and may have a recessed portion having a step such that the sectional shape is the same as an opening shape and uniform until a predetermined depth, and such that the sectional shape is decreased and uniform to a bottom portion after the predetermined depth.

The size of the first accommodation recessed portion 2a and the size of the second accommodation recessed portion 2b may be appropriately set according to the sizes of the microphone element 20 and the infrared light emitting element 21 to be accommodated. The opening of the first accommodation recessed portion 2a has, for example, a length in the longitudinal direction of 4 to 6 mm and a length in the lateral direction of 4 to 6 mm. The size of the second accommodation recessed portion 2b is, for example, 4 to 6 mm in the longitudinal direction and 4 to 6 mm in the lateral direction.

As long as the substrate 2 can accommodate the microphone element 20 and the infrared light emitting element 21, the substrate 2 may be made of a ceramic insulating material, or may be made of a resin insulating material.

When the substrate 2 is made of a ceramic insulating material, a wiring conductor is formed on a dielectric layer made of a ceramic insulating material. Examples of the ceramic insulating material include an aluminum oxide sintered body, a mullite sintered body, a silicon carbide sintered body, an aluminum nitride sintered body, a silicon nitride sintered body, a glass ceramic sintered body, and the like.

When the substrate 2 is made of a resin insulating material, a wiring conductor is formed on a dielectric layer made of an organic material. Examples of the organic materials include an epoxy resin, a polyimide resin, a polyester resin, an acrylic resin, a phenol resin, a fluorine resin, and the like.

The connection wiring 3 includes first connection terminals 3a, second connection terminals 3b, external connection terminals 3c, and internal wiring 3d, and are made of a conductive material such as a metal material. The first connection terminals 3a are disposed in the first accommodation recessed portion 2a, and are to be electrically connected to the microphone element 20 to be accommodated. The second connection terminals 3b are disposed in the second accommodation recessed portion 2b and are to be electrically connected to the infrared light emitting element 21. The external connection terminals 3c are disposed on the other main surface 2d of the substrate 2 and are to be electrically connected to an external circuit such as a power supply circuit and a control circuit. The internal wiring 3d is disposed inside the substrate 2, and electrically connects the first connection terminal 3a and the second connection terminal 3b to the external connection terminals 3c, respectively. The internal wiring 3d includes, for example, a through conductor penetrating the dielectric layer, transmission wiring disposed between the dielectric layers, and the like.

For the connection between the microphone element 20 and the first connection terminals 3a and the connection between the infrared light emitting element 21 and the second connection terminals 3b, various connection methods such as wire bonding connection, flip chip connection, and bump connection can be adopted according to the specifications of each element.

The gas sensor package 10 includes the gas sensor wiring substrate 1, the first lid 4, the cover body 5, and a detection gas sealed in the first accommodation recessed portion 2a. The first lid 4 is a lid covering the first accommodation recessed portion 2a, and is transparent to the infrared light. The detection gas sealed in the first accommodation recessed portion 2a is a gas vibrated by energy obtained by absorbing the infrared light, and in which a detection substance generating the sound wave is in a gaseous state. The microphone element 20 in the first accommodation recessed portion 2a receives the sound wave generated by the detection gas. As the detection gas, for example, carbon dioxide, ammonia, ethyl alcohol or the like can be used, and the type thereof may be the same as or different from a substance to be detected. Since the detection gas is sealed in the first accommodation recessed portion 2a, the detection substance is present in the vicinity of the microphone element 20, and the generated sound wave is reliably received by the microphone element 20.

The cover body 5 covers the first surface 2c of the substrate 2 and defines a space together with the first surface 2c. A space surrounded by the first surface 2c and an inner surface of the cover body 5 is a detection space 11 into which a gaseous substance to be detected is introduced. The cover body 5 is made of, for example, a metal such as aluminum or stainless steel, or a synthetic resin such as an epoxy resin, an acrylic resin, an ABS resin, or a polycarbonate resin. The cover body 5 is formed in a cubic shape, a rectangular d shape, a hemispherical shape, and a semi-cylindrical shape, and one surface and a surface for passing a detection object are open regardless of the shape. One open surface is closed by the first surface 2c to form the open detection space 11. In the present embodiment, the cover body 5 is formed in a semi-cylindrical shape in which both bottom surfaces are open. The cover body 5 is configured in the shape of the inner surface or the like so as to reflect the infrared light irradiated to the detection space 11 on the inner surface, and to advance the infrared light into the first accommodation recessed portion 2a. When the cover body 5 is made of metal, the inner surface thereof can be reflected the infrared light. Even when the cover body 5 is made of a synthetic resin, although the cover body 5 can reflect the infrared light, since the reflectance is lower than that of metal, the reflectance can be improved by disposing a reflection member 9 described later on the inner surface. When the cover body 5 is made of metal, using aluminum or gold, the cover body 5 has high infrared reflectance, and aluminum is more suitable in terms of cost. For fixing the cover body 5 to the substrate 2, a resin-based adhesive or a metal bonding agent such as a solder and a brazing material can be used according to the material of the cover body 5 and the substrate 2.

In the present embodiment, the gas sensor package 10 further includes a second lid 6 covering the second accommodation recessed portion 2b, and is transparent to the infrared light. As described above, although the gaseous substance to be detected is introduced into the detection space 11 from the outside, the introduced gas is introduced not only as the substance to be detected but also as a mixed gas in which air, inert gas, and various other gaseous substances are mixed. If the second lid 6 is not disposed, there is a possibility that the gaseous substance contained in the mixed gas adheres to the front surface of the infrared light emitting element 21 to inhibit the emission of the infrared light, or adheres to the second connection terminal 3b to cause an electrical short circuit. These problems are prevented by disposing the second lid 6.

The first lid 4 and the second lid 6 may be configured to be transparent to the infrared light. The first lid 4 and the second lid 6 may be made of an insulating material having a transmittance of 70% or more, preferably 90% or more, of the infrared light.

As an insulating material forming the first lid 4 and the second lid 6, transparent ceramic materials such as sapphire, glass materials, resin materials, or the like can be used, for example. As the glass material, borosilicate glass, crystallized glass, quartz, soda glass, or the like can be used. As the resin material, polycarbonate resin, unsaturated polyester resin, epoxy resin, or the like can be used. In particular, an insulating material such as silicon or germanium is preferable because the transmittance of the infrared light is high. The first lid 4 made of such a material can shield substantially all of the sound waves emitted by the substance to be detected by absorbing the infrared light in the detection space 11.

In the present embodiment, the second lid 6 is disposed with an aperture member 6a that regulates the emission direction of the infrared light emitted from the infrared light emitting element 21 to the detection space 11 only in a specific direction. The aperture member 6a has an aperture 6a1 smaller than the opening of the second accommodation recessed portion 2b. Since the infrared light transmits only the aperture 6a1 and is emitted to the detection space 11, the emission direction of the infrared light is regulated in the specific direction by the position of the aperture 6a1. By regulating the emission direction of the infrared light only to the specific direction, only the regulated infrared light is reflected by the inner surface of the cover body 5 (reflection member 9 disposed on) and is incident on the inside of the first accommodation recessed portion 2a. Therefore, it is possible to suppress noise due to the infrared light which is unregulated and multi-reflected in the cover body 5. Since the emission amount of the infrared light is also limited by the aperture member 6a, the possibility is reduced that the inner surface of the first accommodation recessed portion 2a and the microphone element 20 in the first accommodation recessed portion 2a is heated by the infrared light which is unregulated and multi-reflected in the cover body 5, and the possibility is reduced that the detection accuracy is reduced.

The aperture member 6a is made of, for example, a thin film that is disposed with the aperture 6a1 and shields the infrared light. The thin film that shields infrared light is a thin film that does not transmit the infrared light by reflecting or absorbing the infrared light. As a material forming such a thin film, inorganic compounds such as a metal and an oxide, organic resin, or the like can be used. In particular, if the material is an inorganic compound or an organic resin, since the material can absorb the infrared light, it is possible to suppress noise due to multiple reflection of the infrared light in the second accommodation recessed portion 2b and the infrared light emitted from the aperture 6a1 in directions other than the regulation direction. When the aperture member 6a is made of metal, metals such as Cr, Ti, Al, Cu, Co, Ag, Au, Pd, Pt, Ru, Sn, Ta, Fe, In, Ni, W, and alloys thereof can be formed by vapor deposition, sputtering, baking, or the like. The aperture 6a1 may be disposed at the time of thin film formation using a mask, or may be formed by physical means such as grinding or chemical means such as etching after thin film formation. The infrared light transmits only the aperture 6a1 and are reflected or absorbed in the thin film portions other than the aperture 6a1, so that the emission direction of the infrared light emitted to the detection space 11 can be regulated. If the position of the aperture 6a1 is directly above the infrared light emitting element 21 (above the direction perpendicular to the bottom surface of the second accommodation recessed portion 2b and passing through the center portion of the infrared light emitting element 21), since the aperture 6a1 is located at the position where the intensity of the infrared light is the strongest, the amount of emission of infrared light is not significantly reduced, even when the aperture member 6a is disposed. Accordingly, it is not required to increase the power applied to the infrared light emitting element 21 in order to increase the emission amount from the infrared light emitting element 21, and it can measure with lower power. Since it is more effective that the aperture member 6a is separated from the infrared light emitting element 21, it can be said that the depth of the second accommodation recessed portion 2b accommodating the infrared light emitting element 21 is preferably deeper than the depth of the first accommodation recessed portion 2a.

Furthermore, the second lid 6 may be disposed with a band pass filter 6b passing only a specific wavelength in the infrared wavelength range. The specific wavelength is a wavelength which a substance to be detected and detection gas absorb, and can generate a sound wave in the detection gas thereby. As the band pass filter 6b, a commonly used one can be used as long as the band pass filter 6b has such characteristics. The band pass filter 6b is formed of, for example, a multilayer film of a high refractive index dielectric film and a low refractive index dielectric film. For example, the band pass filter 6b is disposed in a portion of the aperture 6a1 of the aperture member 6a. As the high refractive index dielectric, for example, $HfO_2$, $Ta_2O_5$, Ge or the like can be used, and as the low refractive index dielectric, for example, ZnS, $SiO_2$, $Al_2O_3$ or the like can be used. The band pass filter 6b can regulate the emission of light of a wavelength other than the specific wavelength in the infrared wavelength region to the detection space 11. The infrared light is absorbed by the substance to be detected and the detection gas, and is for generating the sound wave in the detection gas, so that only a specific wavelength is required. When infrared light of a wavelength other than the specific wavelength, that is, an unnecessary infrared light intrudes into the first accommodation recessed portion 2a, the microphone element 20 in the inner surface of the first accommodation recessed portion 2a and the first accommodation recessed portion 2a is heated by the unnecessary infrared light. When the band pass filter 6b is disposed, the unnecessary infrared light is not emitted from the second accommodation recessed portion 2b, so that distortion due to thermal expansion of the microphone element 20 does not occur due to heating by the unnecessary infrared light. Therefore, there is no reduction in the detection accuracy. The substance in the detection space 11 and the first surface of the substrate 2 are also heated by the unnecessary infrared light. The cover body 5 reflects most of the infrared light on the inner surface thereof and absorbs a portion of the infrared light. The cover body 5 may be distorted by thermal expansion due to the substance in the heated detection space 11 and the substrate 2, or the cover body 5 itself being heated. The distortion of the cover body 5 changes the reflection angle of the infrared light, and there is a possibility that the amount of the infrared light reaching the inside of the first accommodation recessed portion 2a is reduced, and the sensitivity of the device 100 is reduced. By disposing the band pass filter 6b, the possibility of such occurrence can be reduced.

The band pass filter 6b and the aperture member 6a may not be disposed on the same surface as the second lid 6. For example, as in the example shown in FIG. 3B described later, the band pass filter 6b may be disposed on the surface of the second lid 6 on a side of the second accommodation recessed portion 2b, and the aperture member 6a may be disposed on the surface opposite thereto. Conversely, the aperture member 6a may be disposed on the surface of the second lid 6 on a side of the second accommodation recessed portion 2b, and the band pass filter 6b may be disposed on the surface opposite thereto. The band pass filter 6b may be disposed on one surface (entire surface) of the second lid 6, and the aperture member 6a may be further disposed thereon. The aperture 6a1 of the aperture member 6a and the band pass filter 6b may overlap each other, and the infrared light may transmit the band pass filter 6b. It is better to dispose the band pass filter 6b on the entire surface of the second lid 6 than to dispose the band pass filter 6b only in the aperture 6a1 of the aperture member 6a in terms of easiness of production. As in the example shown in FIG. 3, when the aperture member 6a is disposed on the surface of the second lid 6 opposite to the second accommodation recessed portion 2b, since the aperture member 6a is further separated from the infrared light emitting element 21, the aperture member 6a is more effective. The band pass filter 6b can be disposed on the first lid 4 in order to obtain the effect of preventing the intrusion of unnecessary infrared light into the first accommodation recessed portion 2a. The band pass filter 6b may be disposed when the infrared light emitting element 21 emits infrared light having a broad wavelength including an unnecessary infrared light. When the infrared light emitting element 21 is an element that does not emit the unnecessary infrared light and emits only infrared light having a specific wavelength, the band pass filter 6b may not be disposed.

The gas sensor 100 includes an acoustic element (microphone element 20) in the first accommodation recessed portion 2a, an infrared light emitting element 21 in the second accommodation recessed portion 2b, and the gas sensor package 10 described above. For example, a micro electro mechanical system (MEMS) element is used as the microphone element 20 for downsizing. In the MEMS element, the reception accuracy is likely to be reduced due to the distortion due to heat. As the infrared light emitting element 21, a MEMS heater, a light emitting diode (LED), a laser diode (LD) or the like can be used. The MEMS heater emits infrared light having a broad wavelength of approximately 1 to 20 μm with an output of approximately several tens to several hundreds of mW. The LED and the LD can emit infrared light of a single wavelength according to the wavelength absorbed by the substance to be detected (specific wavelength described above) with an output of approximately several mW. When an infrared light emitting element 21 having a large wavelength band, such as a MEMS heater, is used, the transmission band of the band pass filter 6b disposed on the second lid 6 closing the opening of the second accommodation recessed portion 2b is changed. Therefore, since infrared light corresponding to the substance to be detected can be emitted, the gas sensor 100 corresponding to a plurality of types of substances to be detected can be prepared by one infrared light emitting element 21.

A detection method using the gas sensor 100 will be described. As described above, when only the mixed gas or the gaseous substance to be detected is introduced into the detection space 11 from the outside, the infrared light emitting element 21 emits the infrared light. In the emitted infrared light, the infrared light irradiated to the detection space 11 is regulated by the aperture member 6a. The infrared light advancing through the detection space 11 is reflected by the inner surface of the cover body 5 to change the direction, and advances to the first accommodation recessed portion 2a. During the advancing in the detection space 11, at least a portion of the infrared light is absorbed by the substance to be detected. The remaining infrared light after absorption is transmitted through the first lid 4 and advances into the first accommodation recessed portion 2a. A detection gas is sealed in the first accommodation recessed portion 2a, and the infrared light advanced to this point is absorbed by the detection gas, so that a sound wave is generated. The generated sound wave is received by the microphone element 20. The amount of reception by the microphone element 20 represents the amount of infrared light advanced to the inside of the first accommodation recessed portion 2a. That is, if the amount of infrared light is large, the amount of reception is large, and if the amount of infrared light is small, the amount of reception is small. On the other hand, the amount of infrared light advanced to the inside of the first accommodation recessed portion 2a is correlated with the amount of the substance to be detected. Since the substance to be detected absorbs the infrared light, when the amount of the substance to be detected in the detection space 11 increases, the amount of absorption increases, and the amount of the infrared light in the remaining portion decreases. When the amount of the substance to be detected in the detection space 11 decreases, the amount of absorption decreases, and the amount of the infrared light in the remaining portion increases. That is, regarding the relationship between the amount of the substance to be detected and the amount of reception, the amount of reception decreases as the amount of the substance to be detected increases, and the amount of reception increases as the amount of the substance to be detected decreases. Based on this relationship, the amount of the substance to be detected in the detection space 11 can be detected based on the amount of reception. In the present embodiment, since both bottom surfaces of the cover body 5 are open as described above, so-called flow measurement can be performed in which the mixed gas is allowed to continuously flow and detection is continuously performed.

In the sound wave emitted by the substance to be detected absorbing the infrared light in the detection space 11, since a position to be generated is in the detection space 11 wider than the first accommodation recessed portion 2a, there are sound waves that reaches the first accommodation recessed portion 2a and that does not reach the first accommodation recessed portion 2a depending on the position to be generated. Alternatively, even if the sound reaches, the intensity of the sound wave varies. Therefore, when the sound wave generated in the detection space 11 is received by the microphone element 20 in the first accommodation recessed portion 2a, the amount of reception is likely to vary. However, in the present embodiment, substantially all sound waves generated by the detection gas in the first accommodation recessed portion 2a are received by the microphone element 20. The sound wave generated when the substance to be detected absorbs the infrared light is shielded by the first lid 4 in the detection space 11. Therefore, the gas sensor 100 as in the present embodiment is a sensor with higher detection accuracy as compared to the case where the sound wave generated in the detection space 11 is received by the microphone element 20 in the first accommodation recessed portion 2a.

Figure 2:
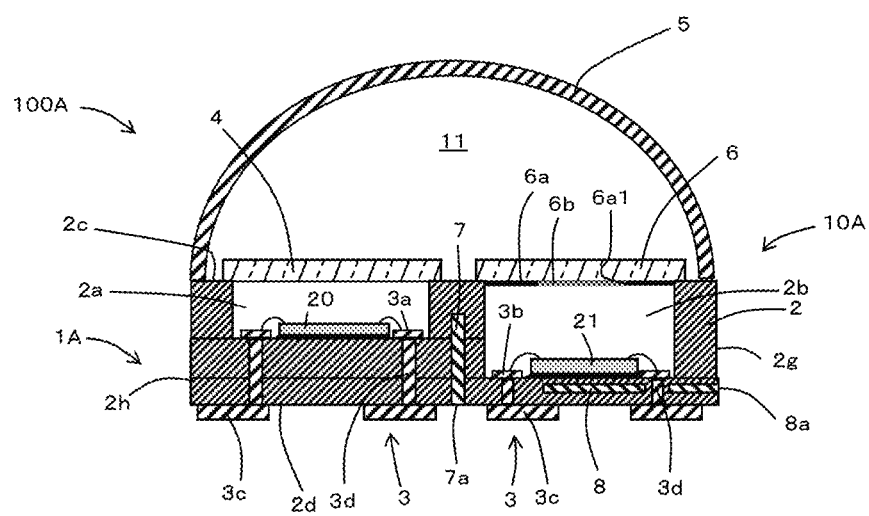
FIG. 2 is a sectional view illustrating a gas sensor wiring substrate, a gas sensor package, and a gas sensor according to a second embodiment.

FIG. 2 is a sectional view illustrating a gas sensor wiring substrate 1A, a gas sensor package 10A, and a gas sensor 100A according to a second embodiment. The present embodiment is different from the first embodiment in the configuration including a first heat transfer member 7 and a second heat transfer member 8, and the other configuration is the same as that of the first embodiment. Therefore, the same reference numerals are assigned to similar configurations and the description will not be repeated.

The first heat transfer member 7 is embedded between the first accommodation recessed portion 2a and the second accommodation recessed portion 2b of the substrate 2, and a portion thereof is exposed to at least one of the other main surface 2d of the substrate 2 and a side surface 2g of the substrate 2. Here, the side surface 2g is a portion adjacent to the second accommodation recessed portion 2b among the plurality of side surfaces of the substrate 2 and close to the second accommodation recessed portion 2b from the first accommodation recessed portion 2a. The first heat transfer member 7 has thermal conductivity higher than that of the dielectric layer, and the first heat transfer member 7 is disposed. Therefore, a portion of the heat toward the microphone element 20 can be guided to the other main surface 2d or the side surface 2g among the heat generated by the infrared light emitting element 21. As a result, the heat which reaches the microphone element 20 beyond the first heat transfer member 7 can be reduced. A portion of the exposed first heat transfer member 7 may be connected to a metal film (not shown) on the other main surface 2d or the side surface 2g, and can transfer more heat to the outside through the metal film. Furthermore, by connecting the metal film to the external circuit substrate with a bonding material such as solder in the same manner as the external connection terminal 3c, more heat can be transferred to the external circuit substrate through the metal film and the bonding material.

When the first heat transfer member 7 has thermal conductivity higher than that of the dielectric layer, since the first heat transfer member 7 can conduct heat, for example, the first heat transfer member 7 may be made of, a metal material as in the connection wiring 3. The first heat transfer member 7 may be embedded, for example, as a plate-like member, or may be embedded as a rod-like member or a columnar member between the first accommodation recessed portion 2a and the second accommodation recessed portion 2b. In the case of a plate-like member, one surface of the side surfaces is an exposed portion 7a exposed to the other main surface 2d, and in the case of a rod-like member or a columnar member, anyone of the tip end portions is the exposed portion 7a exposed to the other main surface 2d.

The second heat transfer member 8 is embedded in at least one of between the second accommodation recessed portion 2b of the substrate 2 and the other main surface 2d and between the second accommodation recessed portion 2b and the side surface 2g of the substrate 2, and a portion thereof is exposed to at least one of the side surface 2g of the substrate 2 and the second surface (other main surface 2d) of the substrate 2. The second heat transfer member 8 has thermal conductivity higher than that of the dielectric layer. The second heat transfer member 8 is disposed, and therefore, the heat toward the other main surface 2d can be guided to the other main surface 2d or the side surface 2g among the heat generated by the infrared light emitting element 21. As a result, the heat which reaches the microphone element 20 can be reduced. Here, the heat is unlikely to be transferred to the first accommodation recessed portion 2a when positions where the second heat transfer member 8 is disposed and a portion thereof is exposed are more separated from the first accommodation recessed portion 2a of the substrate 2. In the example shown in FIG. 2, the second heat transfer member 8 is embedded between the second accommodation recessed portion 2b and the other main surface 2d of the substrate 2, and is exposed to the side surface 2g positioned on the side opposite to the first accommodation recessed portion 2a based on the second accommodation recessed portion 2b, that is, the side surface 2g most separated from the first accommodation recessed portion 2a.

When the second heat transfer member 8 has thermal conductivity higher than that of the dielectric layer, since the second heat transfer member 8 can conduct heat, for example, the second heat transfer member 8 may be made of, a metal material as in the connection wiring 3. The second heat transfer member 8 may be embedded, for example, as a plate-like member, or may be embedded as a rod-like member or a columnar member between the second accommodation recessed portion 2b and the other main surface 2d. In the case of a plate-like member, one surface of the side surfaces is an exposed portion 8a exposed to the side surface 2g, and in the case of a rod-like member or a columnar member, any one of the tip end portions is the exposed portion 8a exposed to the side surface 2g.

Figure 3A:
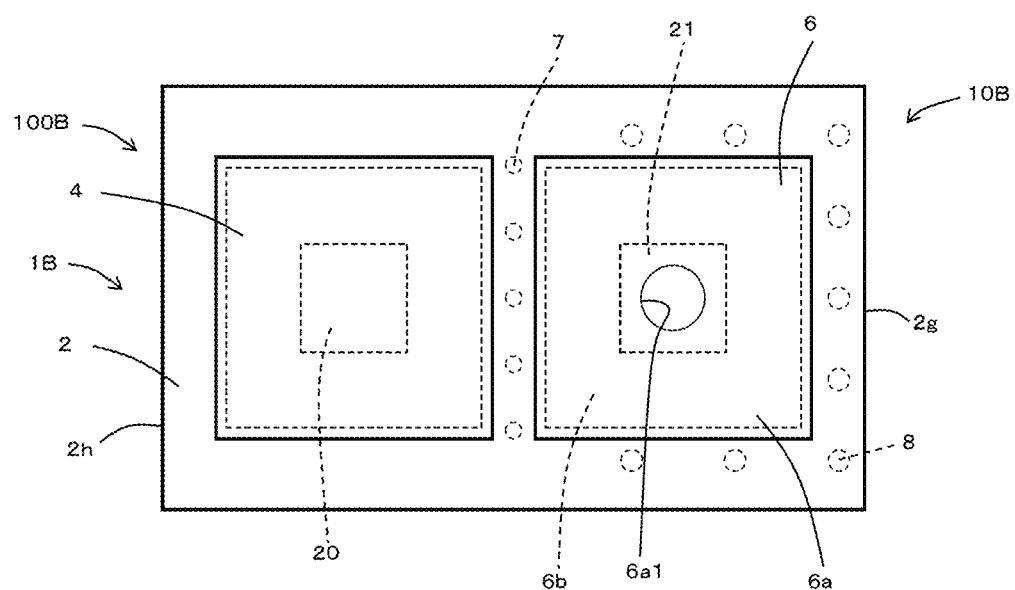
FIG. 3A is a plan view illustrating a gas sensor wiring substrate, a gas sensor package, and a gas sensor according to a third embodiment.
Figure 3B:
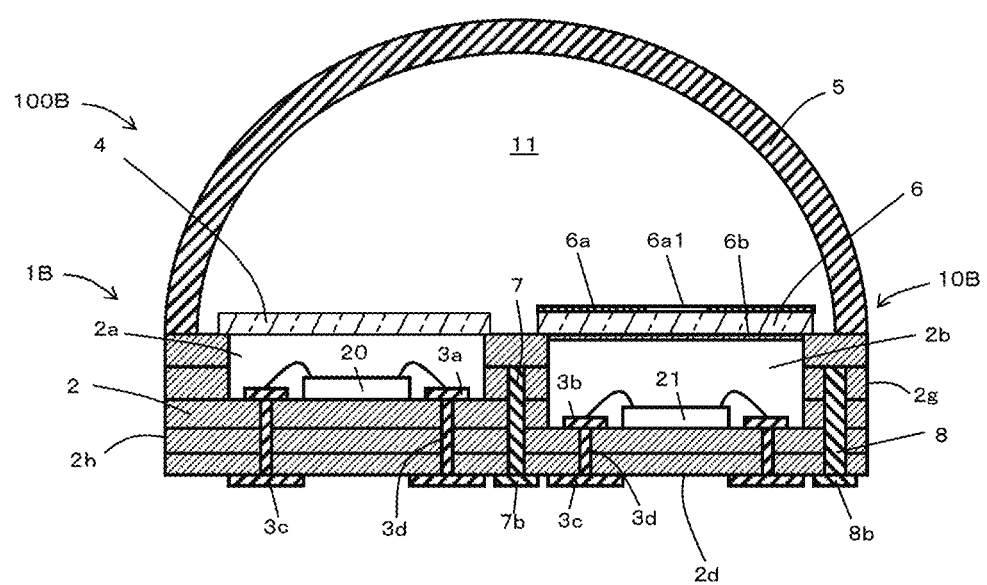
FIG. 3B is a sectional view illustrating the gas sensor wiring substrate, the gas sensor package, and the gas sensor according to the third embodiment.

FIG. 3 is a schematic view illustrating a gas sensor wiring substrate 1B, a gas sensor package 10B, and a gas sensor 100B according to a third embodiment, FIG. 3A is a plan view, and FIG. 3B is a sectional view. In FIG. 3A, the cover body 5 is omitted. In the example shown in FIG. 3, the second heat transfer member 8 is embedded between the second accommodation recessed portion 2b and the side surface 2g, and a portion thereof is exposed to the other main surface 2d. In this example, the second accommodation recessed portion 2b is surrounded by the first heat transfer member 7 and the second heat transfer member 8. When the first heat transfer member 7 and the second heat transfer member 8 are connected to the ground potential, these members can also function as shields against electromagnetic waves that may be generated from the infrared light emitting element 21. In the example shown in FIG. 3, a portion of the exposed first heat transfer member 7 is connected to the metal film 7b on the other main surface 2d, and a portion of the exposed second heat transfer member 8 is connected to the metal film 8b on the other main surface 2d. As a result, more heat can be transferred to the outside. Although it is also possible to dissipate heat from the metal films 7b and 8b to the surrounding air, by bonding the metal films 7b and 8b and the external circuit with a bonding material such as solder, heat can be transferred to the external circuit, and heat transfer to the outside can be effectively performed.

Figure 4:
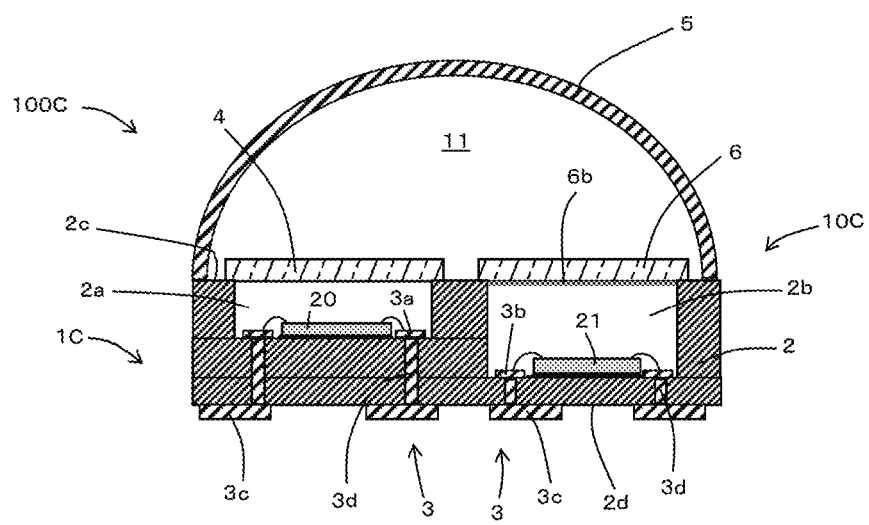
FIG. 4 is a sectional view illustrating a gas sensor wiring substrate, a gas sensor package, and a gas sensor according to a fourth embodiment.

FIG. 4 is a sectional view illustrating a gas sensor wiring substrate 1C, a gas sensor package 10C, and a gas sensor 100C according to a fourth embodiment. The present embodiment is different from the first embodiment in the configuration including the band pass filter 6b similar to that of the first embodiment instead of the aperture member 6a, and the other configuration is the same as that of the first embodiment. Therefore, the same reference numerals are assigned to similar configurations and the description will not be repeated.

In the present embodiment, the band pass filter 6b is disposed on the entire front surface of the second lid 6 instead of the aperture member 6a. As a result, the infrared light emitted from the infrared light emitting element 21 can be emitted to the detection space 11 at a wide angle. That is, without the aperture member 6a, more infrared light can be emitted to the detection space 11. As described above, in the present embodiment, the emitted infrared light is absorbed by the substance to be detected, and detection is performed by the amount of infrared light in the remaining portion, so that the amount of the substance to be detected of an amount absorbing the infrared light emitted in all directions is a maximum value of a detectable amount. Therefore, as the amount of infrared light emitted to the detection space 11 increases, the maximum value of the detectable amount increases, and the measurable range can be expanded. In the present embodiment, by emitting a large amount of infrared light to the detection space 11, the measurable range can be expanded. Since the band pass filter 6b is disposed, only the infrared light of the specific wavelength is emitted to the detection space 11, and the same effect as described above can be obtained.

Figure 5:
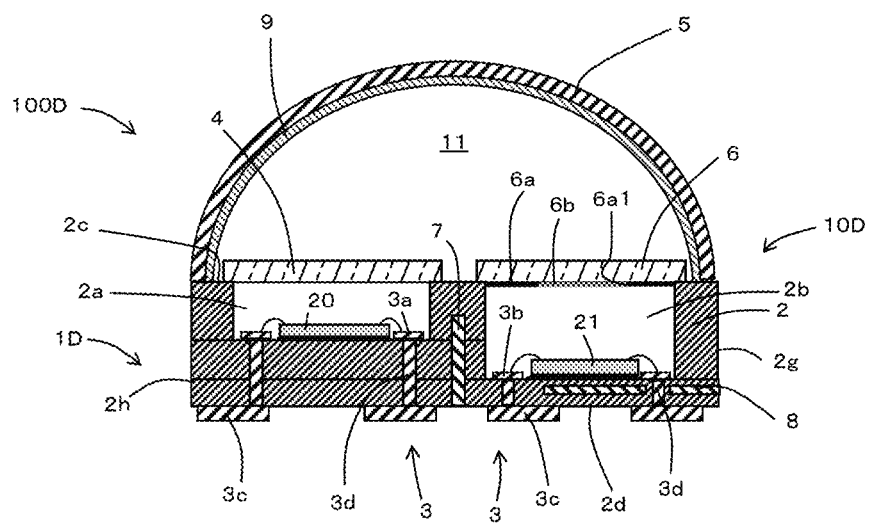
FIG. 5 is a sectional view illustrating a gas sensor wiring substrate, a gas sensor package, and a gas sensor according to a fifth embodiment.

FIG. 5 is a sectional view illustrating a gas sensor wiring substrate 1D, a gas sensor package 10D, and a gas sensor 100D according to a fifth embodiment. The present embodiment is different from the second embodiment in the configuration including the reflection member 9 and the other configuration is the same as that of the second embodiment. Therefore, the same reference numerals are assigned to similar configurations and the description will not be repeated.

The reflection member 9 is a member that reflects the infrared light emitted from the infrared light emitting element 21, and is disposed on the inner surface of the cover body 5. As described above, as the amount of infrared light reflected by the cover body 5 and reaching the first accommodation recessed portion 2a increases, the maximum value of the detectable amount increases and the measurable range is expanded. When the emitted infrared light transmits the cover body 5 or is absorbed by the cover body 5, the amount of reflected infrared light is lost by that amount, the maximum detectable amount is reduced, and the measurable range is narrowed. The reflection member 9 has an infrared reflectance of, for example, 90% or more, and preferably 98% or more. The reflection member 9 can reduce the loss of infrared light by the cover body 5 and reflect substantially all of the emitted infrared light, so that the measurable range can be expanded to the maximum. The reflection member 9 may be disposed by bonding a member made of metal such as aluminum to the inner surface of the cover body 5 or may be disposed by depositing a metal film on the inner surface of the cover body 5 by a plating method or an evaporation method, for example.

Figure 6A:
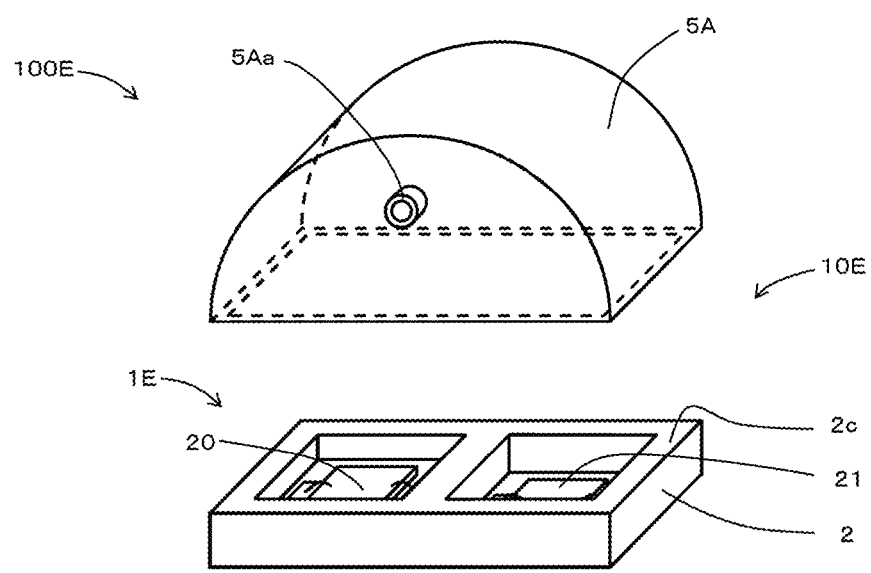
FIG. 6A is an exploded perspective view illustrating a gas sensor wiring substrate, a gas sensor package, and a gas sensor according to a sixth embodiment.
Figure 6B:
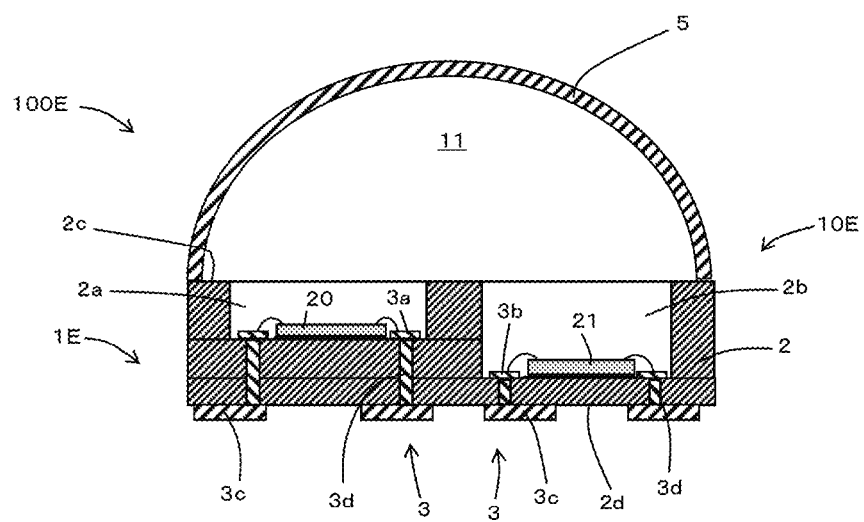
FIG. 6B is a sectional view illustrating the gas sensor wiring substrate, the gas sensor package, and the gas sensor according to the sixth embodiment.

FIG. 6 is a view illustrating a gas sensor wiring substrate 1E, a gas sensor package 10E, and a gas sensor 100E according to a sixth embodiment, FIG. 6A is an exploded perspective view, and FIG. 6B is a sectional view. The exploded perspective view of FIG. 6A is an exploded perspective view in which the cover body 5A is separated.

The configuration of the present embodiment is different from that of the first embodiment in that both the first lid 4 and the second lid 6 are not disposed, and the other configuration is the same as that of the first embodiment. Therefore, the same reference numerals are assigned to similar configurations and the description will not be repeated.

In the present embodiment, the cover body 5A is formed in a semi-cylindrical shape in which both bottom surfaces are closed, and an inlet and outlet 5Aa of the substance to be detected is disposed on one bottom surface. The detection space 11 is a sealed space by the cover body 5A, and the substance to be detected flows in and flows out through the inlet and outlet 5Aa. In the present embodiment, for example, it is possible to perform so-called batch measurement in which a certain amount of mixed gas flows into the detection space 11, is detected, and thereafter the mixed gas flows out from the detection space 11. In the present embodiment, the infrared light generated from the infrared light emitting element 21 in the second accommodation recessed portion 2b detects the sound wave generated by absorption by the substance to be detected in the detection space 11 by the microphone element 20 in the first accommodation recessed portion 2a. In this case, since it is not necessary to seal the detection substance in the first accommodation recessed portion 2a, the gas sensor 100E with a simpler structure can be disposed, so that a highly reliable gas sensor can be obtained.

As a modified example of the present embodiment, although the first lid 4 may be disposed to protect the acoustic element (microphone element 20), the first lid 4 disposed with a transmission hole for transmitting the generated sound wave is disposed. As another modified example, the second lid 6 may be disposed to protect the infrared light emitting element 21, and the second lid 6 may further be disposed with the band pass filter 6b. The specific wavelength which the band pass filter 6b transmits at this time is a wavelength which the substance to be detected in the detection space 11 absorbs, and, as a result, the sound wave can be generated in the substance to be detected. Since the sound wave is not generated by substances other than the substance to be detected, detection accuracy is enhanced. The second lid 6 may be disposed with the aperture member 6a. As a result, since the sound wave is generated only at a specific position in the detection space 11, the variation in the amount of reception by the microphone element 20 in the first accommodation recessed portion 2a is suppressed, and the detection accuracy increases.

In the configuration A, any combination of the above embodiments is also within the scope of the present invention. For example, the first heat transfer member 7 and the second heat transfer member 8 may be disposed in any of the embodiments, the reflection member 9 may be disposed in any of the embodiments, and in the embodiment disposed with the second lid 6, either the aperture member 6a or the band pass filter 6b may be disposed.

(Configuration B)

Figure 7A:
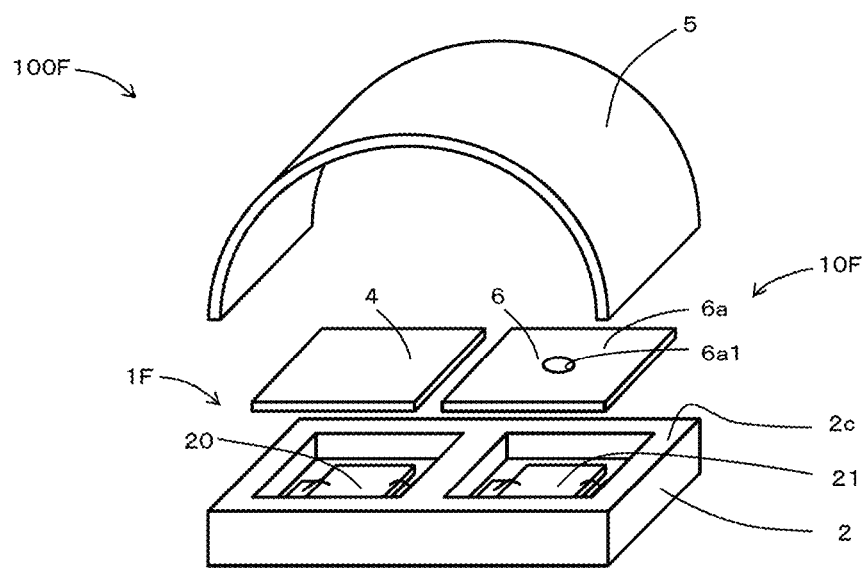
FIG. 7A is an exploded perspective view illustrating a gas sensor wiring substrate, a gas sensor package, and a gas sensor according to a seventh embodiment.
Figure 7B:
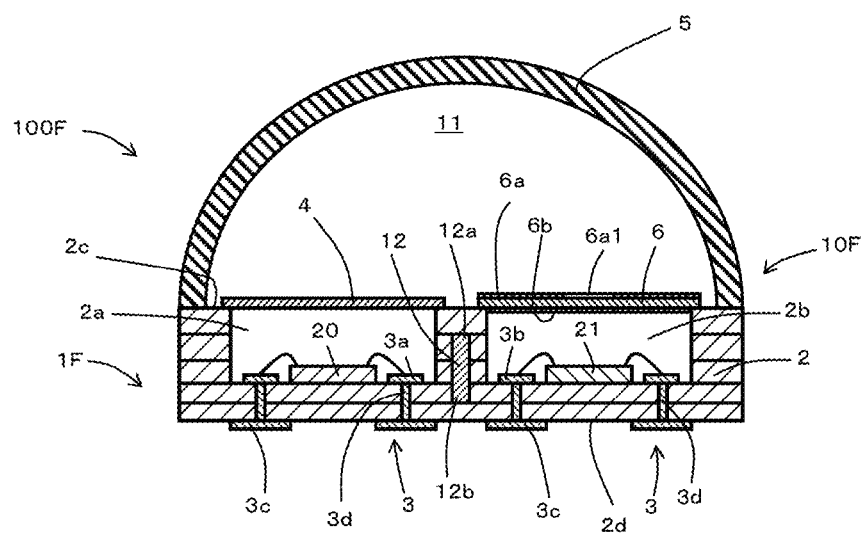
FIG. 7B is a sectional view illustrating the gas sensor wiring substrate, the gas sensor package, and the gas sensor according to the seventh embodiment.

FIG. 7 is a view illustrating a gas sensor wiring substrate 1F, a gas sensor package 10F, and a gas sensor 100F according to a seventh embodiment, FIG. 7A is an exploded perspective view, and FIG. 7B is a sectional view. The exploded perspective view of FIG. 7A is an exploded perspective view in which the first lid 4, the second lid 6, and the cover body 5 are separated.

The gas sensor wiring substrate 1F includes the substrate 2 and the connection wiring 3. The substrate 2 of the present embodiment has a rectangular plate shape, and is formed by laminating a plurality of dielectric layers. At least two recessed portions are disposed in the substrate 2. One of the two recessed portions is the first accommodation recessed portion 2a accommodating the microphone element 20 as the acoustic element, and the other of the two recessed portions is the second accommodation recessed portion 2b accommodating the infrared light emitting element 21. The first accommodation recessed portion 2a and the second accommodation recessed portion 2b are disposed so as to open to one main surface (first surface) 2c of the substrate 2.

In the present embodiment, the thickness of the substrate 2 is, for example, 1 to 2 mm, and for example, the length in the longitudinal direction is 5 to 10 mm, and the length in the lateral direction is 9.5 to 18 mm. The first accommodation recessed portion 2a and the second accommodation recessed portion 2b are arranged side by side in the lateral direction.

The opening shape and the sectional shape of the first accommodation recessed portion 2a and the second accommodation recessed portion 2b are the same as those of the above configuration A, and thus the description thereof will not be repeated.

The size of the first accommodation recessed portion 2a and the size of the second accommodation recessed portion 2b may be appropriately set according to the sizes of the microphone element 20 and the infrared light emitting element 21 to be accommodated. The opening of the first accommodation recessed portion 2a has, for example, a length in the longitudinal direction of 4 to 6 mm, a length in the lateral direction of 4 to 6 mm, and a depth of 0.5 to 1.5 mm. The size of the second accommodation recessed portion 2b is, for example, 4 to 6 mm in the longitudinal direction, 4 to 6 mm in the lateral direction, and 0.5 to 1.5 mm in depth.

As long as the substrate 2 can accommodate the microphone element 20 and the infrared light emitting element 21, the substrate 2 may be made of a ceramic insulating material, or may be made of a resin insulating material. The ceramic insulating material and the resin insulating material are the same as those of the above configuration A, and thus the description thereof will not be repeated.

The configuration of the connection wiring 3 and the connection between each element and the connection terminal are the same as those of the above configuration A, and thus the description thereof will not be repeated.

The low heat conduction portion 12 is disposed between the first accommodation recessed portion 2a and the second accommodation recessed portion 2b of the substrate 2. The infrared light emitting element 21 in the second accommodation recessed portion 2b generates heat during operation, and the heat is transferred inside the substrate 2 to be applied to the microphone element 20 in the first accommodation recessed portion 2a. When the microphone element 20 is thermally expanded and distorted due to this heating, the detection accuracy of the sound wave is reduced. The low heat conduction portion 12 has lower thermal conductivity than that of the dielectric layer, and by disposing the low heat conduction portion 12, heat transfer from the infrared light emitting element 21 to the microphone element 20 can be suppressed more than the virtual path. As a result, the heat reaching the microphone element 20 can be reduced, the heating of the microphone element 20 can be suppressed to reduce the distortion, and the decrease in the detection accuracy of the sound wave can be reduced. When the low heat conduction portion 12 is disposed between the first accommodation recessed portion 2a and the second accommodation recessed portion 2b of the substrate 2, the heat transfer to the microphone element 20 can be suppressed as compared with the substrate in which the low heat conduction portion 12 is not disposed.

In the present embodiment, the low heat conduction portion 12 may have various shapes such as a plate shape, a rod shape, or a columnar shape, or may have another shape. The low heat conduction portion 12 may be made of a material whose thermal conductivity is lower than that of the dielectric layer. For example, as long as the dielectric layer is made of a ceramic material, the low heat conduction portion 12 may be made of a resin material or may be made of a porous ceramic material or the like. Many resin materials have lower thermal conductivity than that of the ceramic material. The porous ceramic material has lower thermal conductivity than that of the dielectric layer as the porous ceramic material as a whole due to the low thermal conductivity of the fine pores as void portions. The low heat conduction portion 12 may be an air layer. That is, the low heat conduction portion 12 may be a void portion as a whole and may be a space disposed in the substrate 2. When the low heat conduction portion 12 is the space, as described above, the space shape may be, for example, various shapes such as a plate shape, a rod shape, or a columnar shape, or may be another shape.

The heat generated by the infrared light emitting element 21 is transmitted to the bottom surface of the second accommodation recessed portion 2b, passes through the inside of the substrate 2, and advances to the first accommodation recessed portion 2a. The low heat conduction portion 12 is disposed in the heat transfer path from the bottom surface of the second accommodation recessed portion 2b to the first accommodation recessed portion 2a. Therefore, the thermal resistance of the heat transfer path becomes higher than the thermal resistance of the virtual path, and the heat reaching the microphone element 20 can be efficiently suppressed. In such a configuration, as in the present embodiment, for example, the low heat conduction portion 12 may be disposed so as to block the heat transfer path connecting the bottom surface of the first accommodation recessed portion 2a and the bottom surface of the second accommodation recessed portion 2b in a sectional view.

As described above, the fact that the conduction of heat generated in the infrared light emitting element 21 is suppressed by disposing the low heat conduction portion 12 means that the heat radiation from the infrared light emitting element 21 is suppressed. Therefore, the infrared light emitting element 21 becomes difficult to be cooled. The infrared light emitting element 21 is a so-called heater element, and emits the infrared light by heat generation. When the infrared light emitting element 21 is cooled by heat radiation, a desired amount of infrared light is not emitted. In order to emit the desired amount of infrared light, it is necessary to increase the applied current to generate heat so as to compensate for the amount of cooling, but when the applied current is increased, power consumption is increased. When the infrared light emitting element 21 is difficult to be cooled by the low heat conduction portion 12, the increase amount of the applied current for heat generation can be suppressed to a small amount, and the increase of the power consumption can be suppressed.

Figure 8A:
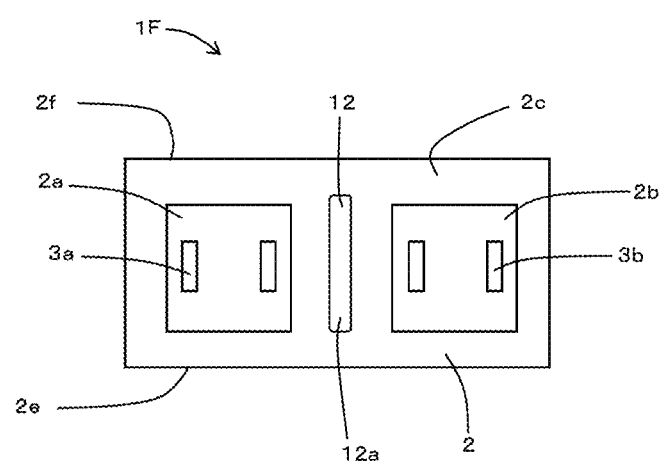
FIG. 8A is a plan view of a gas sensor wiring substrate according to the seventh embodiment.
Figure 8B:
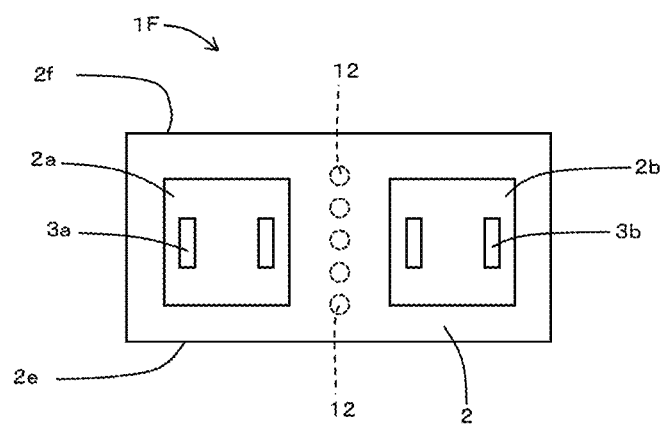
FIG. 8B is a plan view of the gas sensor wiring substrate according to the seventh embodiment.

When the low heat conduction portion 12 is disposed between the first accommodation recessed portion 2a and the second accommodation recessed portion 2b of the substrate 2, one may be disposed, or a plurality thereof may be disposed. The low heat conduction portion 12 may be disposed such that the one side portion 12a as one end portion on the side closer to the first surface 2c of the substrate 2 is exposed to the one main surface 2c of the substrate 2. In that case, the position of the other side portion 12b as the other end portion on the side opposite to the exposed one side portion 12a is disposed to be deeper than the bottom surface of the second accommodation recessed portion 2b. That is, the position of the other side portion 12b is disposed closer to the other main surface (second surface) 2d of the substrate 2 than the bottom surface of the second accommodation recessed portion 2b. FIGS. 8A and 8B are plan views of the gas sensor wiring substrate 1F. In the example shown in FIG. 8A, the one side portion 12a of the flat low heat conduction portion 12 is exposed to the first surface 2c. In the example shown in FIG. 8B, a plurality of cylindrical low heat conduction portions 12 (five in this example) is arranged between the first accommodation recessed portion 2a and the second accommodation recessed portion 2b.

The gas sensor package 10F includes the above gas sensor wiring substrate 1F, the first lid 4, the cover body 5, and the detection gas sealed in the first accommodation recessed portion 2a. The first lid 4, the cover body 5, and the detection gas sealed in the first accommodation recessed portion 2a are all the same as those of the above configuration A, and thus the description thereof will not be repeated.

In the present embodiment, the aperture member 6a that regulates the emission direction of the infrared light emitted from the infrared light emitting element 21 to the detection space 11 only in a specific direction is disposed in the second lid 6. The aperture member 6a is the same as that of the above configuration A, and thus the description thereof will not be repeated.

Furthermore, the band pass filter 6b passing only a specific wavelength in the infrared wavelength range may be disposed in the second lid 6. The band pass filter 6b is the same as that of the above configuration A, and thus the description thereof will not be repeated.

The band pass filter 6b and the aperture member 6a may not be disposed on the same surface of the second lid 6. The disposition of the band pass filter 6b and the aperture member 6a is the same as that of the above configuration A, and thus the description thereof will not be repeated.

The gas sensor 100F includes the acoustic element (microphone element 20) in the first accommodation recessed portion 2a, the infrared light emitting element 21 in the second accommodation recessed portion 2b, and the above gas sensor package 10F. The microphone element 20 and the infrared light emitting element 21 are the same as those of the above configuration A, and thus the description thereof will not be repeated.

The detection method using the gas sensor 100F is also the same as that of the above configuration A, and thus the description thereof will not be repeated.

In the present embodiment, substantially all sound waves generated by the detection gas in the first accommodation recessed portion 2a are received by the microphone element 20. The sound wave generated when the substance to be detected absorbs infrared light in the detection space 11 is shielded by the first lid 4. Therefore, the gas sensor 100F as in the present embodiment has higher detection accuracy as compared to the case where the sound wave generated in the detection space 11 is received by the microphone element 20 in the first accommodation recessed portion 2a.

Figure 9A:
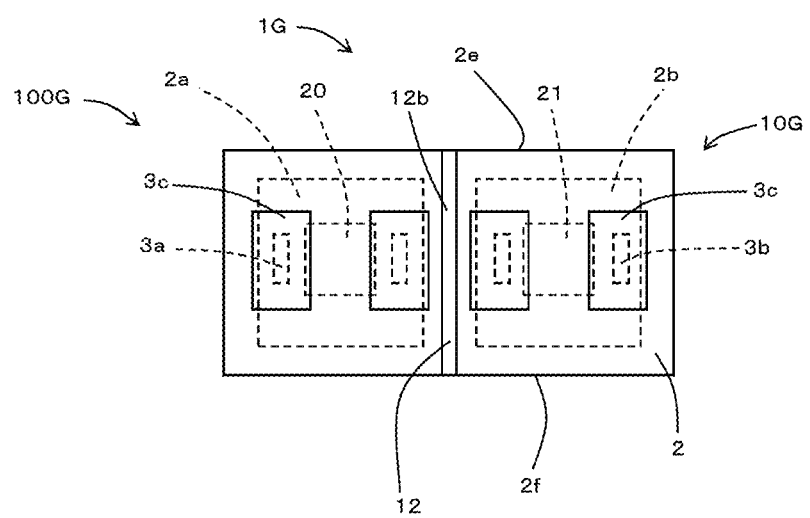
FIG. 9A is a bottom view illustrating a gas sensor wiring substrate, a gas sensor package, and a gas sensor according to an eighth embodiment.
Figure 9B:
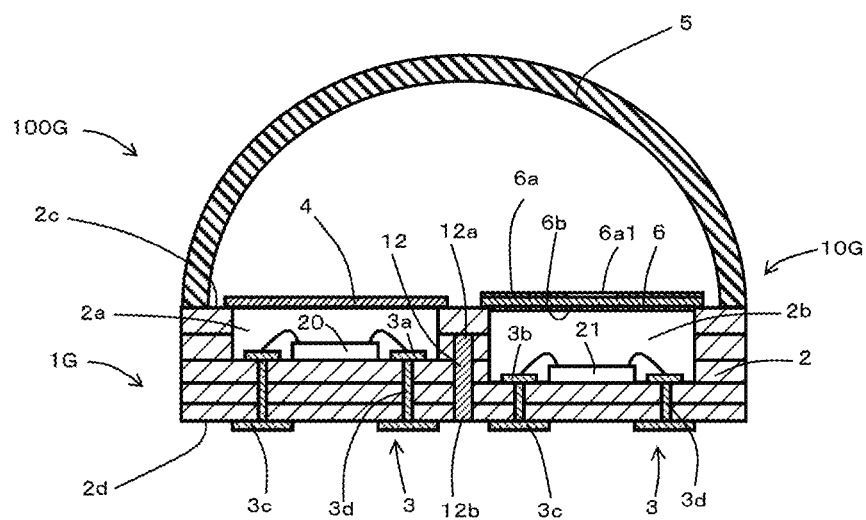
FIG. 9B is a sectional view illustrating the gas sensor wiring substrate, the gas sensor package, and the gas sensor according to the eighth embodiment.

FIG. 9 is a schematic view illustrating a gas sensor wiring substrate 1G, a gas sensor package 10G, and a gas sensor 100G according to an eighth embodiment, FIG. 9A is a bottom view, and FIG. 9B is a sectional view. The present embodiment differs from the seventh embodiment in the depth of the first accommodation recessed portion 2a and the depth of the second accommodation recessed portion 2b as in the configuration A. Furthermore, since the position of the low heat conduction portion 12 in the sectional view is different, and the other configuration is the same as that of the seventh embodiment. Therefore, the same reference numerals are assigned to similar configurations and the description will not be repeated.

In the present embodiment, the depth of the first accommodation recessed portion 2a is different from the depth of the second accommodation recessed portion 2b. In the configuration of the seventh embodiment, the depth of the first accommodation recessed portion 2a is the same as the depth of the second accommodation recessed portion 2b. In the present embodiment, by making the depth of the first accommodation recessed portion 2a different from the depth of the second accommodation recessed portion 2b as in the configuration A, the heat transfer path from the infrared light emitting element 21 as a heat source to the microphone element 20 is elongated. As a result, heating of the microphone element 20 can be suppressed to reduce the distortion than in the seventh embodiment, and a decrease in the detection accuracy of the sound wave can be reduced.

Furthermore, by making the depth of the second accommodation recessed portion 2b deeper than the depth of the first accommodation recessed portion 2a, the distance between the infrared light emitting element 21 as a heat source and the other main surface 2d of the substrate 2 is shortened. The heat generated by the infrared light emitting element 21 is transferred in multiple directions including the direction of the first accommodation recessed portion 2a and the direction of the other main surface 2d. Here, since the other main surface 2d is a heat dissipation surface, by shortening the distance between the infrared light emitting element 21 and the other main surface 2d, the heat is likely to be transferred to the other main surface 2d, and the heat transfer to the first accommodation recessed portion 2a is further suppressed.

In the present embodiment, the depth of the second accommodation recessed portion 2b is deeper than the depth of the first accommodation recessed portion 2a. The depth of the first accommodation recessed portion 2a is, for example, 0.5 to 1 mm, and the depth of the second accommodation recessed portion 2b is, for example, 0.7 to 1.5 mm.

In the present embodiment, in the low heat conduction portion 12, the one side portion 12a is located between the first surface 2c of the substrate 2 and the bottom surface of the second accommodation recessed portion 2b, and the other side portion 12b extends to the second surface 2d of the substrate 2 in a sectional view. The low heat conduction portion 12 may be disposed such that the one side portion 12a is exposed to the first surface 2c as in the seventh embodiment. The low heat conduction portion 12 may be disposed so that the other side portion 12b is exposed to the second surface 2d as in the present embodiment. Also in the present embodiment, as in the seventh embodiment, the heat reaching the microphone element 20 can be efficiently suppressed by disposing the low heat conduction portion 12 in the heat transfer path from the bottom surface of the second accommodation recessed portion 2b to the first accommodation recessed portion 2a.

In the seventh and eighth embodiments, as in the example shown in FIG. 9A, the low heat conduction portion 12 may be disposed over the pair of side surfaces 2e and 2f of the substrate 2 parallel to a direction where the first accommodation recessed portion 2a and the second accommodation recessed portion 2b are arranged. The heat generated by the infrared light emitting element 21 in the second accommodation recessed portion 2b is isotropically conducted in the substrate 2 when there is no place having a large heat transfer resistance such as the low heat conduction portion 12. Therefore, if the low heat conduction portion 12 is disposed as wide as possible, the heat reaching the first accommodation recessed portion 2a, that is, the heat reaching the microphone element 20 can be more efficiently suppressed. By disposing the low heat conduction portion 12 over the pair of side surfaces (longitudinal side surfaces in this example) 2e and 2f of the substrate 2, heat spreading toward the main surface of the substrate 2 toward the microphone element 20 can be more efficiently suppressed.

Figure 10A:
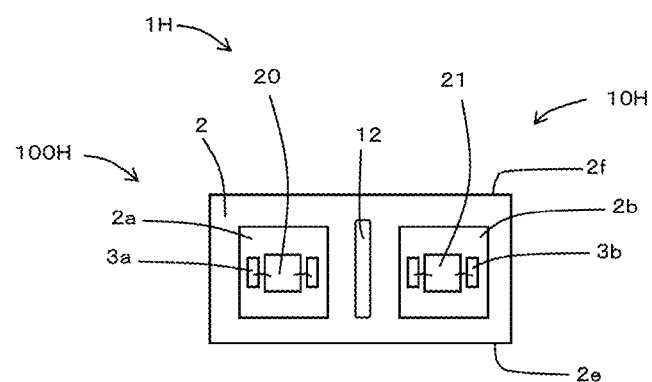
FIG. 10A is a plan view illustrating a gas sensor wiring substrate, a gas sensor package, and a gas sensor according to a ninth embodiment.
Figure 10B:
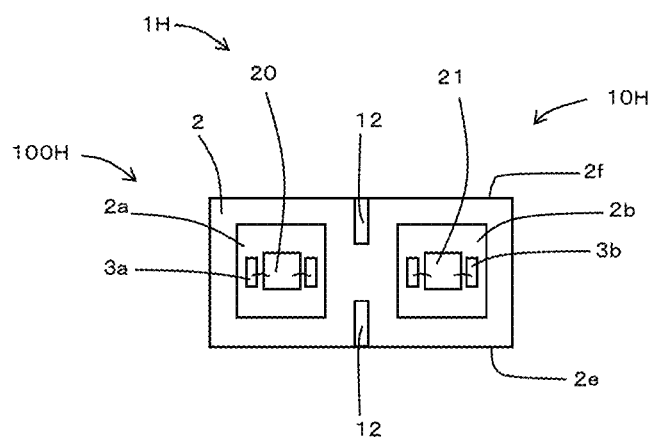
FIG. 10B is a plan view illustrating the gas sensor wiring substrate, the gas sensor package, and the gas sensor according to the ninth embodiment.
Figure 10C:
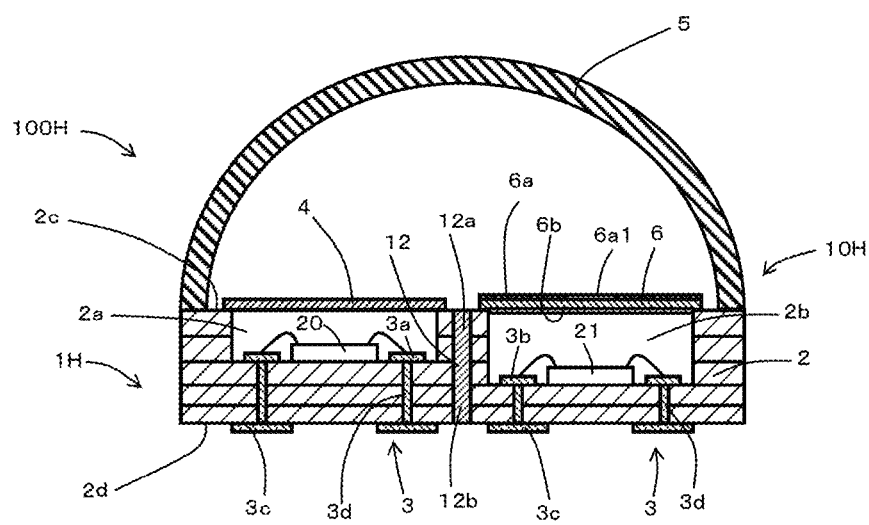
FIG. 10C is a sectional view illustrating the gas sensor wiring substrate, the gas sensor package, and the gas sensor according to the ninth embodiment.

FIG. 10 is a schematic view illustrating a gas sensor wiring substrate 1H, a gas sensor package 10H, and a gas sensor 100H according to a ninth embodiment, FIGS. 10A and 10B are plan views, and FIG. 10C is a sectional view. In FIGS. 10A and 10B, the first lid 4, the second lid 6, and the cover body 5 are omitted. The present embodiment differs from the seventh embodiment in the depth of the first accommodation recessed portion 2a and the depth of the second accommodation recessed portion 2b as in the configuration A. Furthermore, the configuration in which the low heat conduction portion 12 is disposed from the first surface 2c to the second surface 2d of the substrate 2 is different, and the other configuration is the same as that of the seventh embodiment. Therefore, the same reference numerals are assigned to similar configurations and the description will not be repeated.

In the present embodiment, as shown in the sectional view of FIG. 10C, the low heat conduction portion 12 is disposed from the first surface 2c to the second surface 2d of the substrate 2. That is, the low heat conduction portion 12 is disposed to penetrate the substrate 2 in the thickness direction. The heat generated by the infrared light emitting element 21 in the second accommodation recessed portion 2b is isotropically conducted in the substrate 2 when there is no place having a large heat transfer resistance such as the low heat conduction portion 12. Therefore, if the low heat conduction portion 12 is disposed as wide as possible, the heat reaching the first accommodation recessed portion 2a, that is, the heat reaching the microphone element 20 can be more efficiently suppressed. By disposing the low heat conduction portion 12 through the substrate 2 in the thickness direction, the heat spreading in the thickness direction of the substrate 2 toward the microphone element 20 can be more efficiently suppressed.

As shown in the plan view of FIG. 10A, the low heat conduction portion 12 may be disposed at a central portion between the pair of side surfaces 2e and 2f of the substrate 2 in a plan view, or as shown in the plan view of FIG. 10B, may be disposed to extend from the pair of side surfaces 2e and 2f to the center, respectively, in a plan view. In any case, since the low heat conduction portion 12 is disposed in the heat transfer path from the infrared light emitting element 21 to the microphone element 20, the heat from the infrared light emitting element 21 toward the microphone element 20 can be suppressed. When the low heat conduction portion 12 is disposed at a position between the microphone element 20 and the infrared light emitting element 21 in a plan view, the heat from the infrared light emitting element 21 toward the microphone element 20 can be more efficiently suppressed.

Figure 11A:
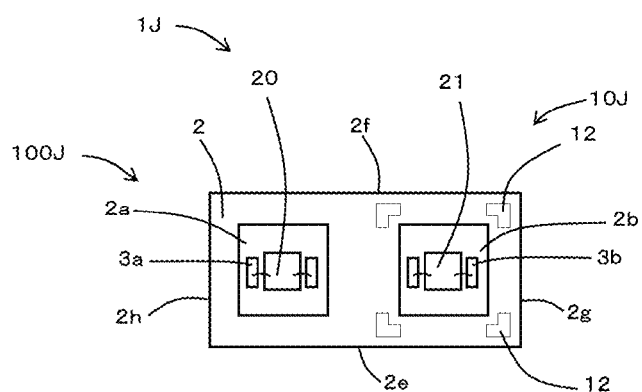
FIG. 11A is a plan view illustrating a gas sensor wiring substrate, a gas sensor package, and a gas sensor according to a tenth embodiment.
Figure 11B:
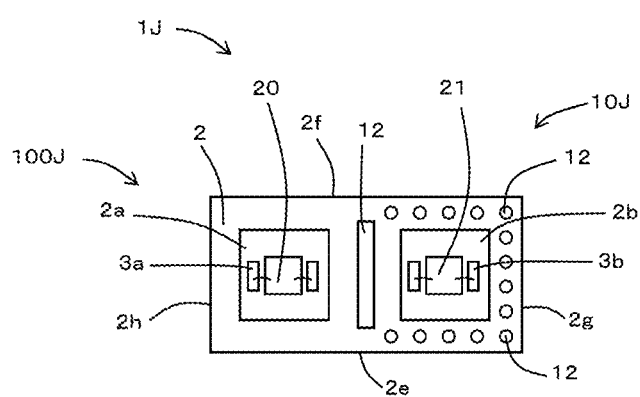
FIG. 11B is a plan view illustrating the gas sensor wiring substrate, the gas sensor package, and the gas sensor according to the tenth embodiment.
Figure 11C:
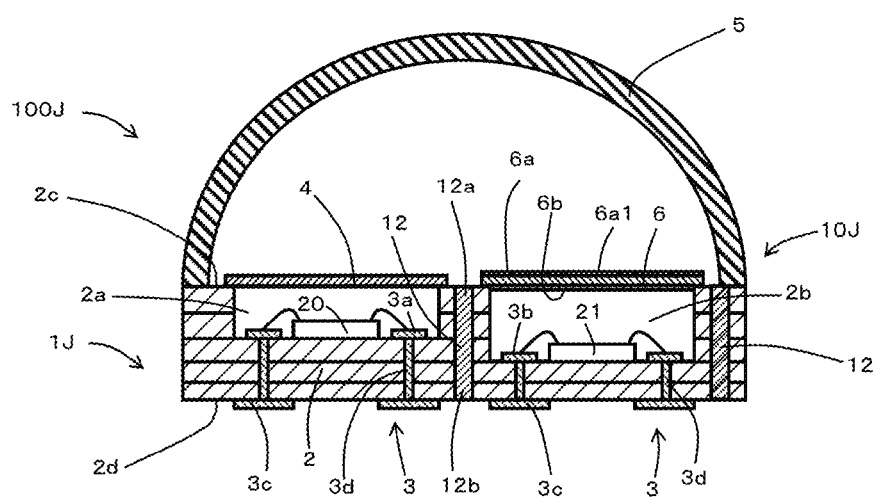
FIG. 11C is a sectional view illustrating the gas sensor wiring substrate, the gas sensor package, and the gas sensor according to the tenth embodiment.

FIG. 11 is a schematic view illustrating a gas sensor wiring substrate 1J, a gas sensor package 10J, and a gas sensor 100J according to a tenth embodiment, FIGS. 11A and 11B are plan views, and FIG. 11C is a sectional view. In FIGS. 11A and 11B, the first lid 4, the second lid 6, and the cover body 5 are omitted. The present embodiment differs from the seventh embodiment in the depth of the first accommodation recessed portion 2a and the depth of the second accommodation recessed portion 2b as in the configuration A. Furthermore, the configuration in which the low heat conduction portion 12 is disposed also between the second accommodation recessed portion 2b and the side surface of the substrate 2 is different, and the other configuration is the same as that of the seventh embodiment. Therefore, the same reference numerals are assigned to similar configurations and the description will not be repeated.

In the example shown in FIGS. 11A and 11B, the low heat conduction portion 12 is disposed at least either between the second accommodation recessed portion 2b and the pair of side surfaces 2e and 2f or between the second accommodation recessed portion 2b and the side surface 2g. The side surface 2g is a side surface on the side closer to the second accommodation recessed portion 2b among the pair of short side surfaces 2g and 2h. In the present embodiment, the low heat conduction portion 12 is disposed between the second accommodation recessed portion 2b and the side surfaces 2e, 2f and 2g in addition to a space between the second accommodation recessed portion 2b and the first accommodation recessed portion 2a. The low heat conduction portion 12 may be disposed between the second accommodation recessed portion 2b and each of the side surfaces, respectively or may be disposed entirely between the second accommodation recessed portion 2b and the side surfaces 2e, 2f, and 2g. When disposed entirely between the second accommodation recessed portion 2b and the side surfaces 2e, 2f, and 2g, the second accommodation recessed portion 2b is surrounded by the low heat conduction portion 12 in a plan view. The low heat conduction portion 12 may be disposed between the second accommodation recessed portion 2b and each of the side surfaces 2e, 2f, and 2g. For example, as shown in FIG. 11A, in the low heat conduction portion 12, a low heat conduction portion 12 having an L-shaped planar shape may be disposed so as to correspond to four corner portions of the second accommodation recessed portion 2b having a square planar shape. In this case, a portion of the L-shaped low heat conduction portion 12 is located between the second accommodation recessed portion 2b and the first accommodation recessed portion 2a. Furthermore, for example, the low heat conduction portion 12 having a strip-like planar shape (three-dimensional shape is plate shape) can also be disposed between the second accommodation recessed portion 2b and the first accommodation recessed portion 2a (position interposed by the microphone element 20 and the infrared light emitting element 21 in a plan view). For example, as shown in FIG. 11B, the low heat conduction portion 12 having the strip-like planar shape (three-dimensional shape is plate shape) is disposed between the second accommodation recessed portion 2b and the first accommodation recessed portion 2a. A plurality of low heat conduction portions 12 having a circular planar shape (three-dimensional is cylindrical shape) is disposed so as to surround along the second accommodation recessed portion 2b between the second accommodation recessed portion 2b and each of the side surfaces 2e, 2f, and 2g.

By disposing the low heat conduction portion 12 between the second accommodation recessed portion 2b and each of the side surfaces 2e, 2f and 2g, the infrared light emitting element 21 is more difficult to be cooled, the amount of increase in applied current for heat generation can be further reduced, and the increase in power consumption can be further suppressed.

In the sectional view shown in FIG. 11C, although the low heat conduction portion 12 is disposed so as to penetrate the substrate 2 in the thickness direction as in the ninth embodiment, the low heat conduction portion 12 may be disposed within the substrate 2 without being exposed as in the seventh embodiment, and only the other side portion 12b may extend to the second surface 2d of the substrate 2 as in the eighth embodiment.

Figure 12:
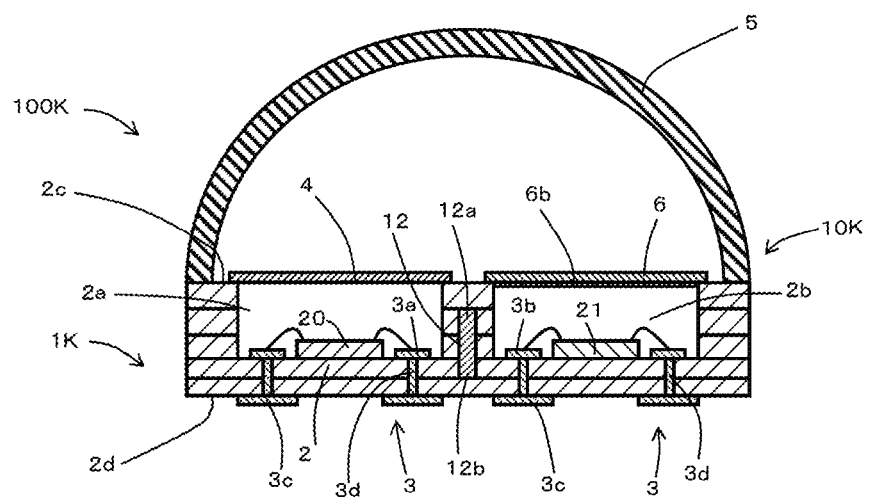
FIG. 12 is a sectional view illustrating a gas sensor wiring substrate, a gas sensor package, and a gas sensor according to an eleventh embodiment.

FIG. 12 is a sectional view illustrating a gas sensor wiring substrate 1K, a gas sensor package 10K, and a gas sensor 100K according to an eleventh embodiment. The present embodiment is different from the seventh embodiment in the configuration including only the band pass filter 6b similar to the seventh embodiment without disposing the aperture member 6a, and the other configuration is the same as that of the seventh embodiment. Therefore, the same reference numerals are assigned to similar configurations and the description will not be repeated.

In the present embodiment, the band pass filter 6b is disposed on the entire front surface of the second lid 6 instead of the aperture member 6a. The features of the present embodiment are the same as those of the above fourth embodiment of the configuration A, and thus the description thereof will not be repeated.

Figure 13:
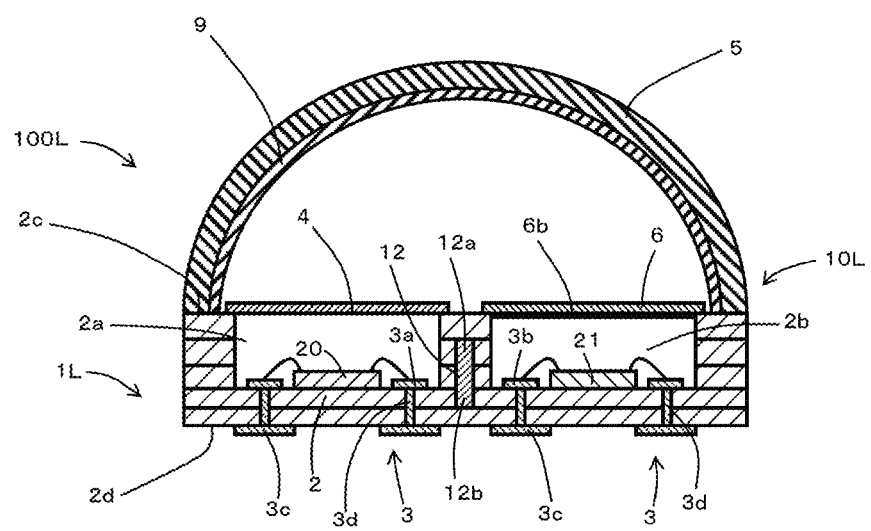
FIG. 13 is a sectional view illustrating a gas sensor wiring substrate, a gas sensor package, and a gas sensor according to a twelfth embodiment.

FIG. 13 is a sectional view illustrating a gas sensor wiring substrate 1L, a gas sensor package 10L, and a gas sensor 100L according to a twelfth embodiment. The present embodiment is different from the eleventh embodiment in the configuration including the reflection member 9 and the other configuration is the same as that of the eleventh embodiment. Therefore, the same reference numerals are assigned to similar configurations and the description will not be repeated.

The reflection member 9 is a member that reflects the infrared light emitted from the infrared light emitting element 21, and is disposed on the inner surface of the cover body 5. The features of the present embodiment are the same as those of the above fifth embodiment of the configuration A, and thus the description will not be repeated.

Figure 14A:
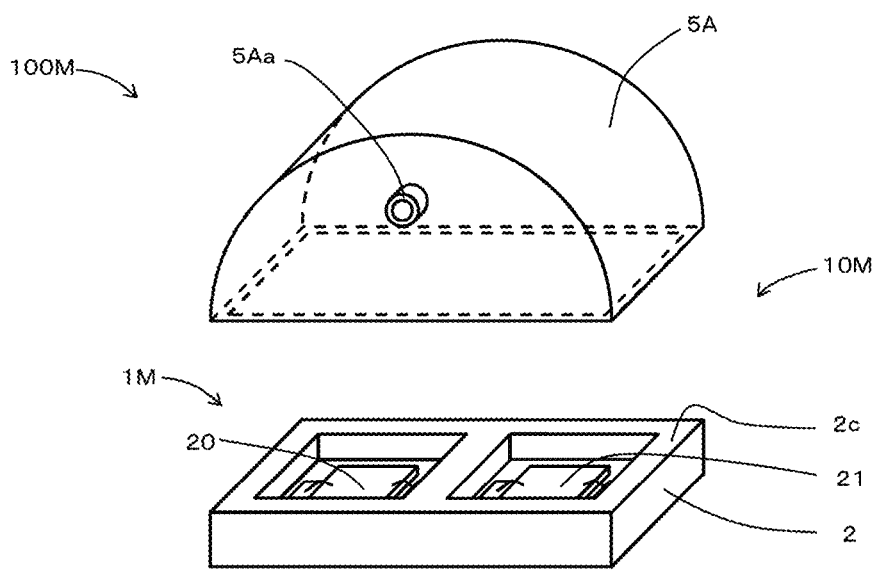
FIG. 14A is an exploded perspective view illustrating a gas sensor wiring substrate, a gas sensor package, and a gas sensor according to a thirteenth embodiment.
Figure 14B:
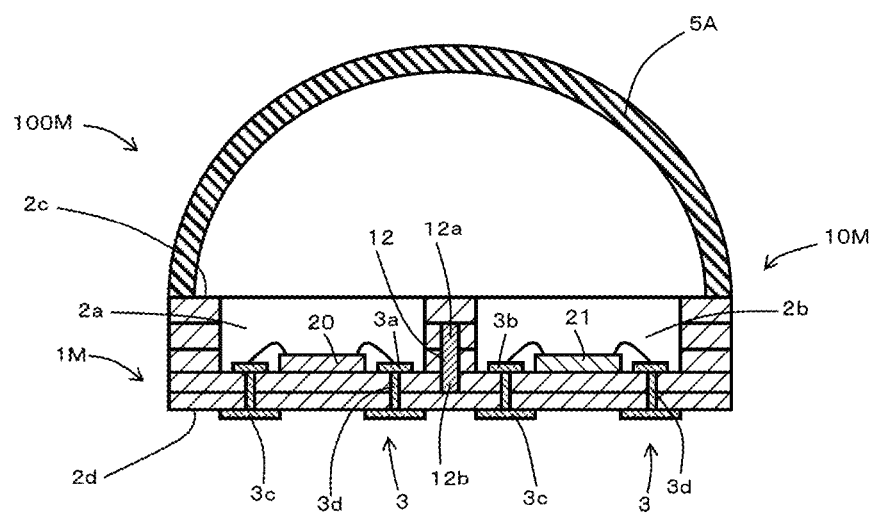
FIG. 14B is a sectional view illustrating the gas sensor wiring substrate, the gas sensor package, and the gas sensor according to the thirteenth embodiment.

FIG. 14 is a view illustrating a gas sensor wiring substrate 1M, a gas sensor package 10M, and a gas sensor 100M according to a thirteenth embodiment, FIG. 14A is an exploded perspective view, and FIG. 14B is a sectional view. The exploded perspective view of FIG. 14A is an exploded perspective view in which the cover body 5A is separated.

The configuration of the present embodiment is different from that of the seventh embodiment in that both the first lid 4 and the second lid 6 are not disposed, and the other configuration is the same as that of the seventh embodiment. Therefore, the same reference numerals are assigned to similar configurations and the description will not be repeated.

In the present embodiment, the cover body 5A is formed in a semi-cylindrical shape in which both bottom surfaces are closed, and the inlet and outlet 5Aa of the substance to be detected is disposed on one bottom surface. The feature and modified example of the present embodiment are the same as those of the above sixth embodiment of the configuration A, and thus the description will not be repeated.

In the configuration B, any combination of the above embodiments is also within the scope of the present invention. For example, in any of the embodiments, as the low heat conduction portion 12, any of a configuration in which the one side portion 12a is exposed to the first surface 2c, a configuration in which the other side portion 12b is exposed to the second surface 2d, a configuration in which none is exposed, and a configuration disposed over the first surface 2c and the second surface 2d can be applied. The reflection member 9 may be disposed in any of the embodiments, and either the aperture member 6a or the band pass filter 6b may be disposed in the embodiment including the second lid 6.

The present invention can be performed in various other forms without departing from the spirit or main features. Accordingly, the above-described embodiments are merely examples in every points, the scope of the present invention is described in the aspects, and is not limited by the text of the specification. Furthermore, all variations and modifications within the scope of the aspects are within the scope of the present invention.

REFERENCE SIGNS LIST 1, 1A, 1B, 1C, 1D, 1E, 1F, 1G, 1H, 1J, 1K, 1L, 1M gas sensor wiring substrate
2 substrate
2a first accommodation recessed portion
2b second accommodation recessed portion
2c one main surface (first surface)
2d the other main surface (second surface)
2e side surface
3 connection wiring
3a first connection terminal
3b second connection terminal
3c external connection terminal
3d internal wiring
4 first lid
5 cover body
6 second lid
6a aperture member
6a1 aperture
6b band pass filter
7 first heat transfer member
7a, 8a exposed portion
8 second heat transfer member
9 reflection member
10, 10A, 10B, 10C, 10D, 10E, 10F, 10G, 10H, 10J, 10K, 10L, 10M gas sensor package
11 detection space
12 low heat conduction portion
20 microphone element
21 infrared light emitting element
100, 100A, 100B, 100C, 100D, 100E, 100F, 100G, 100H, 100J, 100K, 100L, 100M gas sensor

The invention claimed is:

1. A sensor wiring substrate comprising:
a plate-like substrate comprising a plurality of dielectric layers that are laminated, and
a first accommodation recessed portion for accommodating an acoustic element and a second accommodation recessed portion for accommodating an infrared light emitting element that are disposed on a first surface; and
connection wiring comprising
a first connection terminal disposed in the first accommodation recessed portion for electrically connecting to the acoustic element,
a second connection terminal disposed in the second accommodation recessed portion for electrically connecting to the infrared light emitting element,
external connection terminals for electrically connecting to an external circuit, and
internal wiring electrically connecting the first connection terminal and the second connection terminal to the external connection terminals, respectively, and
wherein a depth of the first accommodation recessed portion is different from a depth of the second accommodation recessed portion.

2. The sensor wiring substrate according to claim 1, wherein
the depth of the second accommodation recessed portion is deeper than the depth of the first accommodation recessed portion.

3. The sensor wiring substrate according to claim 1, further comprising
a first heat transfer member:
which has thermal conductivity higher than that of each of the plurality of dielectric layers;
which is embedded between the first accommodation recessed portion and the second accommodation recessed portion of the substrate; and
a portion of which is exposed to at least one of a second surface of the substrate opposite to the first surface and a side surface of the substrate.

4. The sensor wiring substrate according to claim 1, further comprising
a second heat transfer member:

which has thermal conductivity higher than that of each of the plurality of dielectric layers;

which is embedded at least one of between the second accommodation recessed portion and a second surface of the substrate opposite to the first surface, and between the second accommodation recessed portion and a side surface of the substrate; and a portion of which is exposed to at least one of the side surface of the substrate and the second surface of the substrate.

5. The sensor wiring substrate according to claim 1, further comprising a low heat conduction portion having thermal conductivity lower than that of each of the plurality of dielectric layers, and disposed between the first accommodation recessed portion and the second accommodation recessed portion of the substrate.

6. The sensor wiring substrate according to claim 5, wherein in a cross-sectional view, the low heat conduction portion comprises:

one end portion located between the first surface of the substrate and the bottom surface of the second accommodation recessed portion, and an other end portion extending to a second surface opposite to the first surface of the substrate.

7. The sensor wiring substrate according to claim 5, wherein the low heat conduction portion is disposed from the first surface to a second surface opposite to the first surface.

8. The sensor wiring substrate according to claim 5, wherein the low heat conduction portion is further disposed between the second accommodation recessed portion and a side surface of the substrate.

9. The sensor wiring substrate according to claim 5, wherein the low heat conduction portion comprises a void portion.

10. A sensor package comprising:

the sensor wiring substrate according to claim 1; and a cover body covering the first surface of the substrate with a space between the cover body and the first surface, wherein a gaseous substance for detection is to be introduced into the space.

11. The sensor package according to claim 10, further comprising:

a first lid that closes an opening of the first accommodation recessed portion and is transparent to infrared light; and a detection gas that is sealed in the first accommodation recessed portion, and absorbs the infrared light and generates a sound wave.

12. The sensor package according to claim 10, further comprising a second lid that closes an opening of the second accommodation recessed portion and is transparent to the infrared light.

13. The sensor package according to claim 12, further comprising a band pass filter disposed on the second lid and being transparent only to infrared light having a wavelength range absorbed by the gaseous substance to be detected, and by the detection gas.

14. The sensor package according to claim 12, further comprising an aperture member which is disposed on the second lid and comprises an aperture smaller than the opening of the second accommodation recessed portion.

15. The sensor package according to claim 10, further comprising a reflection member which is disposed on an inner surface of the cover body and reflects infrared light emitted from the infrared light emitting element.

16. A sensor device comprising:

the sensor package according to claim 10;

the acoustic element in the first accommodation recessed portion; and the infrared light emitting element in the second accommodation recessed portion.

17. A sensor wiring substrate comprising:

a plate-like substrate comprising a plurality of dielectric layers that are laminated, and a first accommodation recessed portion for accommodating an acoustic element and a second accommodation recessed portion for accommodating an infrared light emitting element that are disposed on a first surface;

connection wiring comprising a first connection terminal disposed in the first accommodation recessed portion for electrically connecting to the acoustic element, a second connection terminal disposed in the second accommodation recessed portion for electrically connecting to the infrared light emitting element, external connection terminals for electrically connecting to an external circuit, and internal wiring electrically connecting the first connection terminal and the second connection terminal to the external connection terminals, respectively; and a low heat conduction portion having thermal conductivity lower than that of each of the plurality of dielectric layers, and disposed between the first accommodation recessed portion and the second accommodation recessed portion of the substrate, wherein the low heat conduction portion is further disposed between the second accommodation recessed portion and a side surface of the substrate.

18. The sensor wiring substrate according to claim 17, wherein in a cross-sectional view, the low heat conduction portion comprises:

one end portion located between the first surface of the substrate and the bottom surface of the second accommodation recessed portion, and an other end portion extending to a second surface opposite to the first surface of the substrate.

19. The sensor wiring substrate according to claim 17, wherein the low heat conduction portion is disposed from the first surface to a second surface opposite to the first surface.

* * * * *